United States Patent
Lee et al.

(10) Patent No.: US 8,580,450 B2
(45) Date of Patent: Nov. 12, 2013

(54) FUEL CELL SYSTEM

(75) Inventors: Eon Soo Lee, Gyeongsangbuk-do (KR); Jae Hyuk Jang, Seoul (KR); Tae Kon Koo, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 15 days.

(21) Appl. No.: 13/067,158

(22) Filed: May 12, 2011

(65) Prior Publication Data

US 2011/0318611 A1   Dec. 29, 2011

(30) Foreign Application Priority Data

Jun. 23, 2010   (KR) .................. 10-2010-0059616

(51) Int. Cl.
*H01M 8/04*   (2006.01)

(52) U.S. Cl.
USPC ........... 429/433; 429/434; 429/435; 429/436; 429/440; 429/441; 429/515

(58) Field of Classification Search
USPC ..................... 429/419, 433–442, 462, 515
See application file for complete search history.

(56) References Cited

U.S. PATENT DOCUMENTS

| | | |
|---|---|---|
| 2006/0157102 A1 | 7/2006 | Nakajima et al. |
| 2010/0233796 A1 | 9/2010 | Kurihara et al. |

FOREIGN PATENT DOCUMENTS

| | | |
|---|---|---|
| JP | 2001-23666 | 1/2001 |
| JP | 2007-42437 | 2/2007 |
| JP | 2009-87955 | 4/2009 |
| JP | 2010-245025 | 10/2010 |
| KR | 10-2010-0002360 | 1/2010 |
| KR | 1020100002360 A * | 1/2010 |

OTHER PUBLICATIONS

Korean Office Action dated Apr. 12, 2012 issued in corresponding Korean Patent Application No. 10-2010-0059616.

* cited by examiner

*Primary Examiner* — Patrick Ryan
*Assistant Examiner* — Ben Lewis

(57)   ABSTRACT

There is provided a fuel cell system. The fuel cell system includes a fuel cell generating electricity and heat by an electrochemical reaction between a fuel and air, a thermoelectric element converting heat, emitted from the fuel cell, into electrical energy, and a heat storage tank storing heat emitted from the thermoelectric element. The fuel cell system includes therein a configuration allowing for the conversion of heat, emitted from a fuel cell, into electricity or the utilization of heat, thereby minimizing the amount of heat that is released at the final stage. Therefore, a reduction in the size of a heat storage tank can be achieved, and the electricity conversion efficiency of a fuel cell can be improved.

8 Claims, 2 Drawing Sheets

FUEL CELL SYSTEM

CROSS-REFERENCE TO RELATED APPLICATIONS

This application claims the priority of Korean Patent Application No. 10-2010-0059616 filed on Jun. 23, 2010, in the Korean Intellectual Property Office, the disclosure of which is incorporated herein by reference.

BACKGROUND OF THE INVENTION

1. Field of the Invention

The present invention relates to a fuel cell system, and more particularly, to a fuel cell system having high electricity conversion efficiency.

2. Description of the Related Art

In general, a fuel cell is a device that generates electricity by an electrochemical reaction between air and fuel (i.e., hydrogen, LNG, LPG or the like). Basically, fuel cells are power generation systems that decompose air, which contains hydrogen and oxygen, using an electrochemical reaction and convert electrons, generated from the decomposition process, directly into electrical energy.

Such fuel cells are drawing attention due to their generation of green alternative energy, in that only water ($H_2O$) is created after power generation.

Unlike existing power generation technologies adopting combustion, steam generation and turbine driving processes, fuel cells generate electricity directly from fuels without using a combustion process, and accordingly create less noise and air pollutants. Therefore, fuel cells are considered to be both efficient and eco-friendly.

Fuel cells include a reformer that generates a hydrogen gas by reforming a hydrocarbon fuel such as alcohol, methane, butane, LNG and the like, and a fuel cell stack that generates electrical energy by a chemical reaction between hydrogen and oxygen.

Fuel cell batteries may be classified into various kinds, such as Polymer Electrolyte Membrane Fuel cells (PEMFC), Direct Methanol Fuel Cells (DMFC), Molten-Carbonate Fuel Cells (MCFC), Soil Oxide Fuel Cells (SOFC), according to the chemical composition of a stack and the kind of initial fuel used as a source of hydrogen supply.

In the case in which heat energy generated from a reformer and a fuel cell stack in a power generation system adopting fuel cells is mostly released to the outside, the electricity conversion efficiency of a fuel may be impaired. Herein, the electricity conversion efficiency refers to the efficiency of converting a fuel into electrical energy. For the purpose of preventing this efficiency impairment, a power generation system using fuel cells, according to the related art, employs a plurality of heat exchangers so as to recover waste heat.

However, in the case in which the power generation system using fuel cells includes a plurality of heat exchangers, complications in system configuration and undesirable pipe extensions occur, causing loss in pipes such as a pressure drop. Furthermore, according to the related art, different heat exchangers need to be used for waste heat from a reformer and a stack, or an additional power supplier or a heat storage device needs to be installed in order to use waste heat generated from the power generation system using fuel cells.

Of late, systems allowing waste heat from a power generation system using fuel cells to be reused for room heating or water heating have been being provided.

SUMMARY OF THE INVENTION

An aspect of the present invention provides a fuel cell system having high electricity conversion efficiency.

According to an aspect of the present invention, there is provided a fuel cell system including: a fuel cell generating electricity and heat by an electrochemical reaction between a fuel and air; a thermoelectric element converting heat from the fuel cell into electrical energy; and a heat storage tank storing heat from the thermoelectric element.

The fuel cell system may further includes a combustor performing combustion upon a non-reactive fuel and air from the fuel cell, and supplying heat generated by the combustion to the thermoelectric element.

The fuel cell system may further include a resupply pipe supplying heat from the fuel cell, back to the fuel cell.

The fuel cell system may further include: a combustor performing combustion upon a non-reactive fuel and air from the fuel cell, and supplying heat generated by the combustion to the thermoelectric element; and a resupply pipe supplying heat from the combustor to the fuel cell.

The fuel cell system may further include a resupply pipe supplying heat from the thermoelectric element to the fuel cell.

The fuel cell system may further include a thermoelectric element converting heat from the surface of the fuel cell into electrical energy.

The fuel cell system may further include a resupply pipe supplying heat from the fuel cell back to the fuel cell.

The fuel cell system may further include a combustor performing combustion upon a non-reactive fuel and air from the fuel cell, and supplying heat generated by the combustion to the thermoelectric element.

The fuel cell system may further include: a combustor performing combustion upon a non-reactive fuel and air from the fuel cell, and supplying heat generated by the combustion to the thermoelectric element; and a resupply pipe supplying heat from the combustor to the fuel cell.

The fuel cell system may further include a resupply pipe supplying heat from the thermoelectric element, converting heat from the fuel cell into electrical energy, to the fuel cell.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
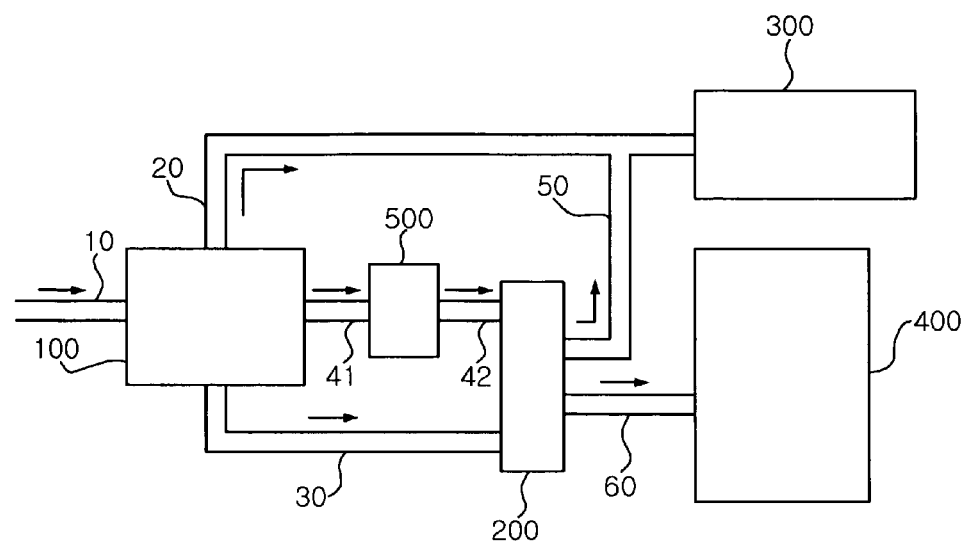
FIG. 1 is a schematic view illustrating a fuel cell system according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity. Like reference numerals in the drawings denote like elements, and thus their description will be omitted.

FIG. 1 is a schematic view illustrating fuel cell system according to an exemplary embodiment of the present invention.

A fuel cell system, according to an exemplary embodiment of the present invention, includes a fuel cell 100 generating electricity and heat by an electrochemical reaction between a fuel and air, a thermoelectric element 200 converting heat, emitted from the fuel cell 100, into electrical energy, and a heat storage tank 400 storing heat generated from the thermoelectric element 200.

The fuel cell 100 generates electricity by an electrochemical reaction upon receiving a fuel and air. Reference numeral '10' in the drawing may be understood as a pipe that supplies a fuel and air to the fuel cell 100.

In general, the fuel cell 100 decomposes air, containing hydrogen and oxygen, through an electrochemical reaction, and converts electrons generated during this decomposition into electrical energy.

The fuel, although not limited thereto, may utilize a hydrocarbon fuel such as alcohol, methane, butane or LNG in general.

The fuel cell 100 may include a reformer generating a hydrogen gas by reforming a fuel, and a fuel cell stack generating electrical energy by a chemical reaction between hydrogen and oxygen.

According to the chemical composition of the stack and the kind of initial fuel used as a source of hydrogen supply, the fuel cell 100 may be classified into a Polymer Electrolyte Membrane Fuel Cell (PEMFC), a Direct-Methanol Fuel Cell (DMFC), a Molten Carbonate Fuel Cell (MCFC), a Phosphoric Acid Fuel Cell (PAFC), or a Solid Oxide Fuel Cell (SOFC). According to this exemplary embodiment, the kinds of fuel cell are not limited.

The fuel cell 100 emits heat while generating electricity from the reformer and the fuel cell stack. The temperature of heat from the fuel cell 100 varies according to types of fuel cell. A low-temperature type PEMFC operates at a temperature of approximately 80° C., and the temperature of heat from the PEMFC is approximately 80° C. or lower. A high-temperature type SOFC operates at a temperature ranging from approximately 600° C. to 1000° C., and the temperature of heat from the SOFC is less than the temperature range of between approximately 600° C. and 1000° C.

Electricity, generated from the fuel cell 100, may be supplied to a power device 300 and used as power. Reference numeral '20' in the drawing may be understood as a pipe that supplies electricity, generated from the fuel cell 100, to the power device 300.

In addition, heat from the fuel cell 100 is supplied to the thermoelectric element 200. Reference numeral '30' in the drawing may be understood as a pipe that supplies heat, emitted from the fuel cell 100, to the thermoelectric element 200.

The thermoelectric element 200 converts heat energy supplied from the fuel cell 100 into electrical energy, and the converted electricity may be used as power. Reference numeral '50' may be understood as a pipe that supplies electricity, generated from the thermoelectric element 200, to the power device 300.

Normally, heat, generated while a fuel cell is in operation, is difficult to use as energy for power generation and is thus released to the outside. This may result in low electricity conversion efficiency in a fuel cell.

However, according to this exemplary embodiment, heat emitted from a fuel cell is converted into electrical energy by the use of a thermoelectric element, thereby enhancing the electricity conversion efficiency of the fuel cell. Here, the electricity conversion efficiency increases as a fuel cell operates at a higher temperature.

The thermoelectric element 200 emits heat in the process of converting received heat energy into electricity. According to this exemplary embodiment, heat emitted from the thermoelectric element 200 may be sent to the heat storage tank 400 and be stored as heat energy. Reference numeral '60' in the drawing may be understood as a pipe that sends heat from the thermoelectric element 200 to the heat storage tank 400.

According to this exemplary embodiment, a reduction in the size of the heat storage tank 400 can be achieved, since a portion of heat emitted from the fuel cell 100 is converted into electrical energy through the thermoelectric element 200 and only a remaining portion of the heat is thereafter stored in the heat storage tank 400.

In this exemplary embodiment, a combustor 500 may be disposed between the fuel cell 100 and the thermoelectric element 200.

The fuel cell 100, although causing a reaction between a fuel and air therein, may still include residual (non-reactive) fuel and air. The residual non-reactive fuel and air are released, heated to an operating temperature.

According to this exemplary embodiment, the non-reactive fuel and air from the fuel cell 100 may be supplied to the combustor 500, and heat, generated thereafter by the combustion in the combustor 500, may be supplied to the thermoelectric element 200 (see arrow 42 in the drawing) and used in conversion into electrical energy.

Reference numeral '41' may be understood as a pipe that supplies non-reactive fuel and air from the fuel cell 100 to the combustor 500, and reference numeral '42' may be understood as a pipe that supplies heat from the combustor 500 to the thermoelectric element 200.

Such non-reactive fuel and air, when being released from the fuel cell 100, heated to an operating temperature, contain chemical energy due to their combustion reaction, which works advantageously in achieving high electricity energy efficiency.

Figure 2:
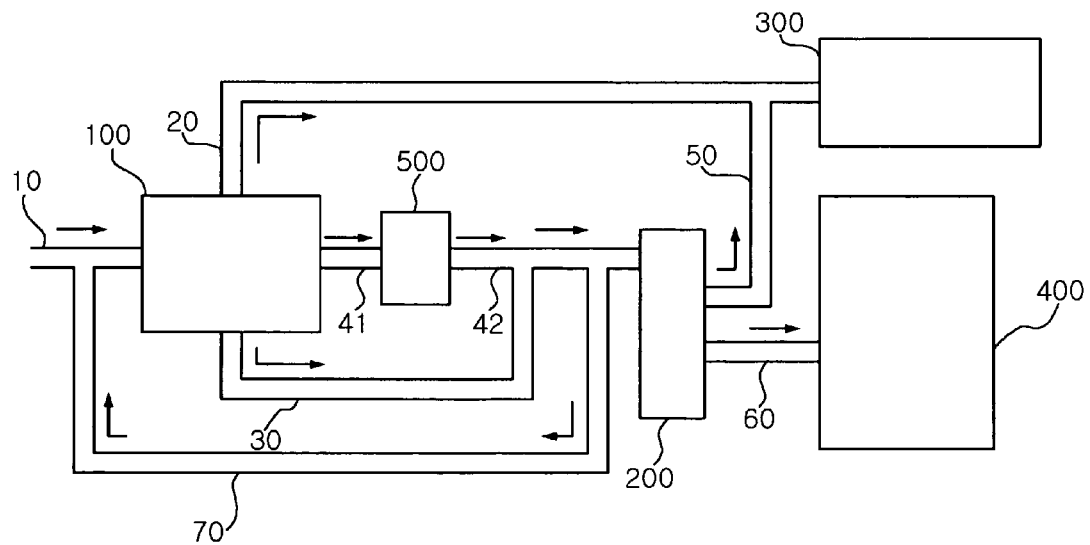
FIG. 2 is a schematic view illustrating a fuel cell system according to another exemplary embodiment of the present invention.

FIG. 2 is a schematic view illustrating a fuel cell system according to another exemplary embodiment of the present invention. The same reference numerals as those in the previous embodiment indicate the same elements. Therefore, the following description associated with FIG. 2 will be made mainly with regard to different elements.

The fuel cell system, according to this exemplary embodiment, includes a fuel cell 100 generating electricity and heat due to an electrochemical reaction between a fuel and air, a thermoelectric element 200 converting heat from the fuel cell into electrical energy, and a heat storage tank 400 storing heat generated from the thermoelectric element 200.

Furthermore, as in the exemplary embodiment associated with FIG. 1, a combustor 500 may be disposed between the fuel cell 100 and the thermoelectric element 200.

According to this exemplary embodiment, a resupply pipe 70 is provided to supply heat, released from the fuel cell 100, back to the fuel cell 100.

Heat, emitted from the fuel cell 100, returns to the fuel cell 100 through the resupply pipe 70 and serves to heat a fuel and air being supplied to the fuel cell 100. As the fuel and air, supplied to the fuel cell 100, are heated in advance, the efficiency of the fuel cell can be improved.

As shown in FIG. 2, the resupply pipe 70 may be disposed between the combustor 500 and the thermoelectric element 200, and supply heat, generated from the combustor 500, back to the fuel cell 100.

Although not shown, the resupply pipe 70 may resupply a portion of heat, emitted from the fuel cell 100, to the fuel cell, before the heat is supplied to the thermoelectric element 200.

Furthermore, the resupply pipe 70 may resupply a portion of heat, emitted from the thermoelectric element 200, to the fuel cell, before the heat is supplied to the heat storage tank 400.

Figure 3:
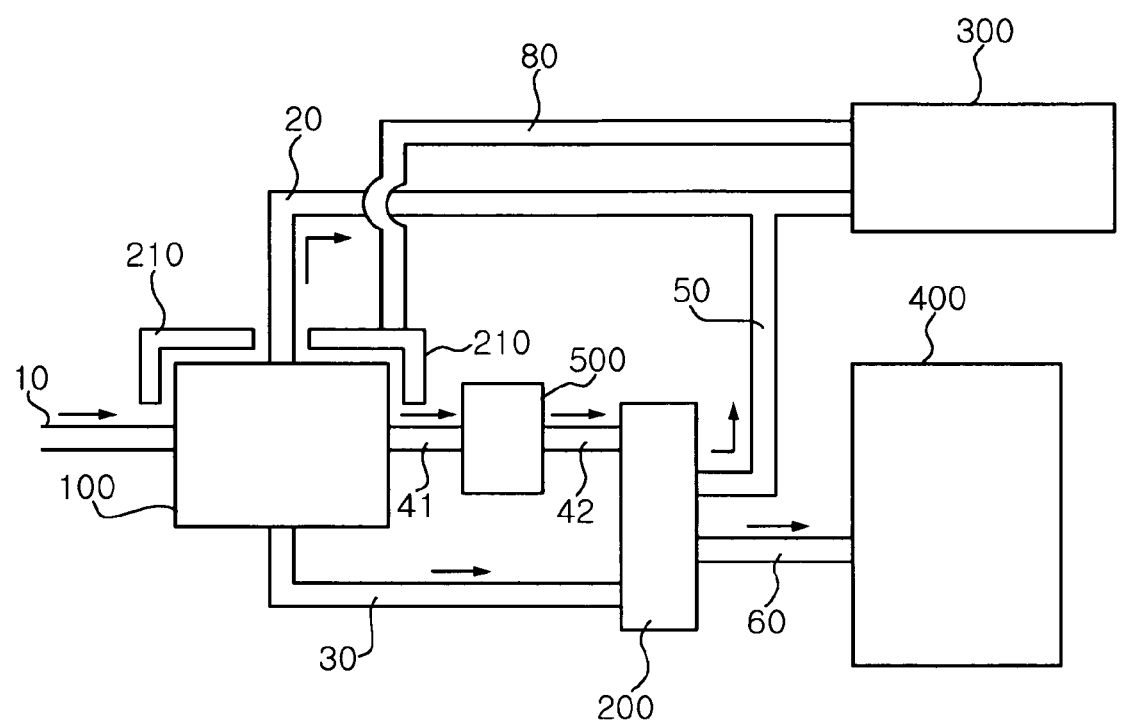
FIG. 3 is a schematic view illustrating a fuel cell system according to another exemplary embodiment of the present invention.

FIG. 3 is a schematic view illustrating a fuel cell system according to another exemplary embodiment of the present invention. The same reference numerals as those in the previous embodiment indicate the same elements. Therefore, the following description associated with FIG. 3 will be made, mainly regarding different elements to the previous ones.

A fuel cell system, according to this exemplary embodiment, includes a fuel cell 100 generating electricity and heat by an electrochemical reaction between a fuel and air, a thermoelectric element 200 converting heat emitted from the fuel cell 100 into electrical energy, and a heat storage tank 400 storing heat generated from the thermoelectric element 200. Furthermore, the fuel cell system may include a combustor 500 disposed between the fuel cell 100 and the thermoelectric element 200.

According to this exemplary embodiment, the fuel cell system includes another thermoelectric element 210 that converts heat, generated from the surface of the fuel cell 100, into electrical energy.

The fuel cell 100 maintains high temperature during operation. In this exemplary embodiment, the thermoelectric element 210 may be disposed on the surface of the fuel cell 100, so that heat, emitted from the surface of the fuel cell 100, can be converted into electrical energy. Electricity from the thermoelectric element 210 disposed on the surface of the fuel cell 100 may be supplied to a power device 300 and be used as power. Reference numeral '80' may be understood as a pipe that supplies electricity, generated from the thermoelectric element 210 disposed on the surface of the fuel cell 100, to the power device 300.

According to this exemplary embodiment, the electricity conversion efficiency of the fuel cell can be enhanced further.

The fuel cell system, according to this exemplary embodiment, may include a resupply pipe (not shown) that supplies heat, emitted from the fuel cell 100, back to the fuel cell 100. The resupply pipe may supply a portion of heat, emitted from the fuel cell 100, back to the fuel cell 100, before the heat is supplied to the thermoelectric element 200. Also, the resupply pipe may supply a portion of heat, emitted from the thermoelectric element 200, back to the fuel cell 100, before the heat is supplied to the heat storage tank 400.

According to exemplary embodiments of the present invention, the fuel cell system is provided with a configuration allowing for the conversion of heat from a fuel cell into electricity or the utilization of the heat, thereby minimizing the amount of heat being released at the final stage. Therefore, a reduction in the size of a heat storage tank can be achieved, and the electricity conversion efficiency of a fuel cell can be improved.

The fuel cell system, according to exemplary embodiments, may be utilized in small-sized fuel cells for mobile devices, such as cellular phones, laptop computers, MP3 devices and the like, medium-sized fuel cells for home or vehicles, or large-sized fuel cells for buildings, commercial use or distributed power generation systems.

As set forth above, according to exemplary embodiments of the invention, heat generated from a fuel cell is converted into electrical energy by a thermoelectric element, so that the electricity conversion efficiency of the fuel cell can be increased.

Furthermore, a heat storage tank can be miniaturized since a portion of heat, generated from the fuel cell, is converted into electrical energy by a thermoelectric element, and a remaining portion of the heat is then stored in the heat storage tank in the end.

Furthermore, heat from the fuel cell returns to the fuel cell through a resupply pip so as to heat a fuel and air being supplied to the fuel cell. As the fuel and air supplied to the fuel cell are heated in advance, the efficiency of the fuel cell can be improved.

While the present invention has been shown and described in connection with the exemplary embodiments, it will be apparent to those skilled in the art that modifications and variations can be made without departing from the spirit and scope of the invention as defined by the appended claims.

What is claimed is:

1. A fuel cell system comprising:
   a fuel cell generating electricity and heat by an electrochemical reaction between a fuel and air;
   a thermoelectric element converting heat from the fuel cell into electrical energy;
   a heat storage tank storing heat from the thermoelectric element; and
   a combustor performing combustion upon a non-reactive fuel and air from the fuel cell, and supplying heat generated by the combustion to the thermoelectric element.

2. The fuel cell system of claim 1, further comprising a resupply pipe supplying heat from the fuel cell, back to the fuel cell.

3. The fuel cell system of claim 1, further comprising:
   a resupply pipe supplying heat from the combustor to the fuel cell.

4. The fuel cell system of claim 1, further comprising a resupply pipe supplying heat from the thermoelectric element to the fuel cell.

5. The fuel cell system of claim 1, further comprising a thermoelectric element converting heat from the surface of the fuel cell, into electrical energy.

6. The fuel cell system of claim 5, further comprising a resupply pipe supplying heat from the fuel cell, back to the fuel cell.

7. The fuel cell system of claim 5, further comprising:
   a resupply pipe supplying heat from the combustor, to the fuel cell.

8. The fuel cell system of claim 5, further comprising a resupply pipe supplying heat from the thermoelectric element, converting heat from the fuel cell into electrical energy, to the fuel cell.

* * * * *